(12) United States Patent
Vickers

(10) Patent No.: US 6,720,588 B2
(45) Date of Patent: Apr. 13, 2004

(54) AVALANCHE PHOTODIODE FOR PHOTON COUNTING APPLICATIONS AND METHOD THEREOF

(75) Inventor: James S. Vickers, San Jose, CA (US)

(73) Assignee: Optonics, Inc., Mountain View, CA (US)

(*) Notice: Subject to any disclaimer, the term of this patent is extended or adjusted under 35 U.S.C. 154(b) by 16 days.

(21) Appl. No.: 10/294,434

(22) Filed: Nov. 13, 2002

(65) Prior Publication Data

US 2003/0098463 A1 May 29, 2003

Related U.S. Application Data

(60) Provisional application No. 60/333,941, filed on Nov. 28, 2001.

(51) Int. Cl.$^7$ .................... H01L 31/0328; H01L 31/107

(52) U.S. Cl. .................. 257/186; 257/438; 257/460; 257/461; 257/464; 257/458; 257/447

(58) Field of Search .................. 257/59, 438, 458, 257/186, 184, 447, 460, 461, 464

(56) References Cited

U.S. PATENT DOCUMENTS

| | | | |
|---|---|---|---|
| 5,539,221 A | 7/1996 | Tsuji et al. | 257/186 |
| 5,543,629 A | 8/1996 | Nakamura et al. | 257/21 |
| 5,912,478 A | 6/1999 | Barrou et al. | 257/185 |
| 6,218,657 B1 | 4/2001 | Bethune et al. | 250/214 |
| 6,342,701 B1 | 1/2002 | Kash | 250/458.1 |

FOREIGN PATENT DOCUMENTS

| | | | |
|---|---|---|---|
| EP | 082787 | 6/1983 | H01L/31/10 |
| EP | 451931 | 10/1991 | H01L/31/107 |
| EP | 549292 | 6/1993 | H01L/31/107 |
| EP | 609884 | 8/1994 | H01L/31/107 |
| EP | 1134812 | 9/2001 | H01L/31/0352 |
| JP | 2001-237453 | * 8/2001 | |

OTHER PUBLICATIONS

McIntyre, R. J., Multiplication Noise in Uniform Avalanche Diodes, IEEE Transaction on Electron Devices, ED 13, 164–168 (1966).

McIntryre R. J., A New Look at Impact ionization—Part I: A Theory of Gain, Noise, Breakdown Probability, and Frequency Response, IEEE Transaction on Electron Devices, 46, 1623–1631 (1999).

(List continued on next page.)

Primary Examiner—Minhloan Tran
Assistant Examiner—Tan Tran
(74) Attorney, Agent, or Firm—Joseph Bach

(57) ABSTRACT

An improved APD structure and an improved manner of operating APD's particularly beneficial for a single photon detection applications are provided. An APD is provided having an absorption region, a control region, and a multiplication region, wherein the multiplication region has a k value of approximately 1. In one example the multiplication region comprises a doped InP layer. The field control layer is designed so as to produce a reduction of electric field that is equal to the multiplication region's breakdown electric field, plus or minus $5V/\mu m$. The method comprises applying a potential across the APD so as to induce an electric field across the multiplication region that exceeds the breakdown field; while having the control region shield the absorption region to prevent excessive noise.

20 Claims, 3 Drawing Sheets

| |
|---|
| 580 Metallization Contact Layer |
| 570 $p^+$-InP Layer |
| 560 $i$-InP Multiplication Layer |
| 550 $n$-InP Field Control Layer |
| 540 $n$-InGaAsP Grading Layer |
| 530 $n$-InGaAs or $n$-InGaAsP Absorber |
| 520 $i$-InGaAs or $i$-InGaAsP Absorber |
| 510 $n^+$-InP Buffer Layer |
| 500 $n^+$-InP Substrate |

OTHER PUBLICATIONS

Yuan, P., Anselm, K.A., Hu, C., Nie, H., Lenox, C., Holms, A. L., Streetman, B. G., Campbell, J. C., and McIntyre, R. J., A New Look at Impact Ionization—Part II: Gain and Noise in Short Avalanche Photodiodes, IEEE Transactions on Electron Devices, 46, 1632–1639 (1999).

Campbell, J.C., Nie H., Lenox, C., Kinsey, g., Yuan, P., Holmes, A. L., Jr. and Streetman, B. G., High Speed Resonant–Cavity InGaAs/InAlAs Avalanche Photodiodes, IEEE Journal of High Speed Electronics and Systems 10, 327–337 (2000).

Campbell, J. C., Chandrasekhar, S., Tsang, W. T., Qua, G. J., and Johnson, B. C., Multiplication Noise of Wide–Bandwidth InP/InGaAsP/InGaAs Avalanche Photodiodes, Journal of Lightwave technology 7, 473–477, (1989).

Kinsey, G. S., Hansing, C. C., Holmes, A. L. Jr., Streetmand, B. G., Campbell, J. C., and Dentai, A. G., Waveguide $In_{0.53}Ga_{0.47}As$–$In_{0.52}Al_{0.48}As$ Avalanche Photodiode, IEEE Photonics Technology Letters 12, 416–418 (2000).

Kinsey, G. S., Campbell, J. C., and Dentai, A. G., Waveguide Avalanche Photodiode Operating at 1.55m with a gain–Bandwidth Product of 320 GHz, IEEE Photonics Tachnology Letters 13, 842–844 (2001).

C. Lenox, H. Nie, P. Yuan, G. Kinsey, A. L. Holmes, Jr., B.G. Streetman, J.C.Campbell, Resonant–Cavity InGaAs–InAlAs Avalanche Photodiodes with Gain–Bandwidth Product of 290 GHz,IEEE Photonics Technology Letters, Vol 11, No. 9 (1999).

B. Huttner, J. Brendel, Photon–Counting Techniques for Fiber Measurements, Lightwave, (2000).

P. Yuan, S. Wang, X. Sun, X.G. Zheng, A.L.Holmes, Jr., J.C.Campbell, Avalanche Photodiodes with an Impact–Ionization–Engineered Multiplication Region, IEEE Photonics Technology Letters, Vol 12, No. 10 (2000).

K. Junsang, Y. Yamamoto, Noise–Free Avalanche Multiplication in Si Solid State Photomultipliers, Appl. Phys. Lett. 70 (21) (1997).

Avalanche Photodiodes: A User's Guide, http://optoelectronics.perkinelmer.com/library/papers/tp5.asp.

A. Rochas, P.A. Popovic, A Geiger Mode Avalanche Photodiode.

S. Vasile, P. Gothoskar, D.Sdrulla, R. Farrell, Photon Detection with High Gain Avalanche Photodiode Arrays, IEEE Trans. Nucl. Sci. 45, 720 (1998).

T. Nesheim, Single photon detection using avalanche photodiode, a master thesis done in *Quantum Cryptography Project* at the *Department of Physical Electronics*, http://www.vadl.com/qcr/torbjoern/ Chapter 3.

In0.53Ga0.47 As/In0.52A10.48As Separate Absorption, Charge, and Multiplication Layer Long Wavelength Avalanche Photodiode; J.C. Dries, K.J. Thomson and S.R. Forrest; Electronics Letters, Feb. 18, 1999 vol. 35, No. 4.

\* cited by examiner

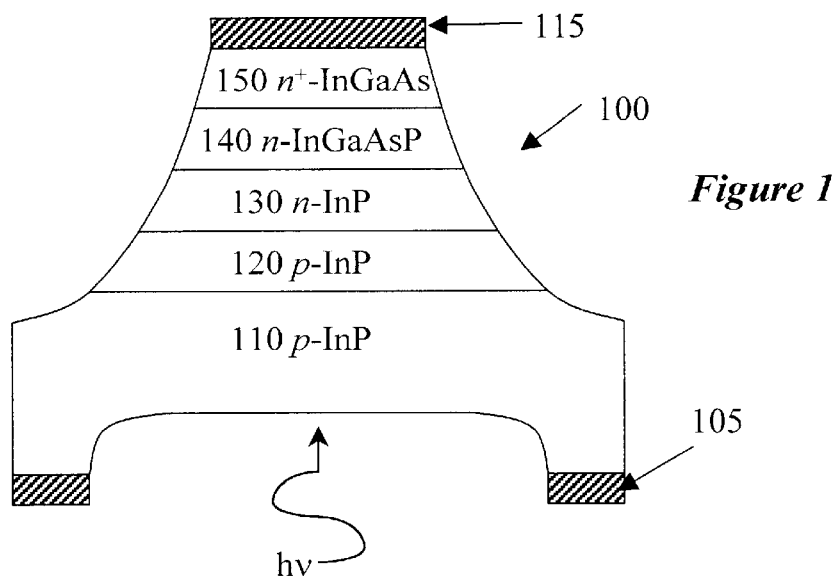
*Figure 1*
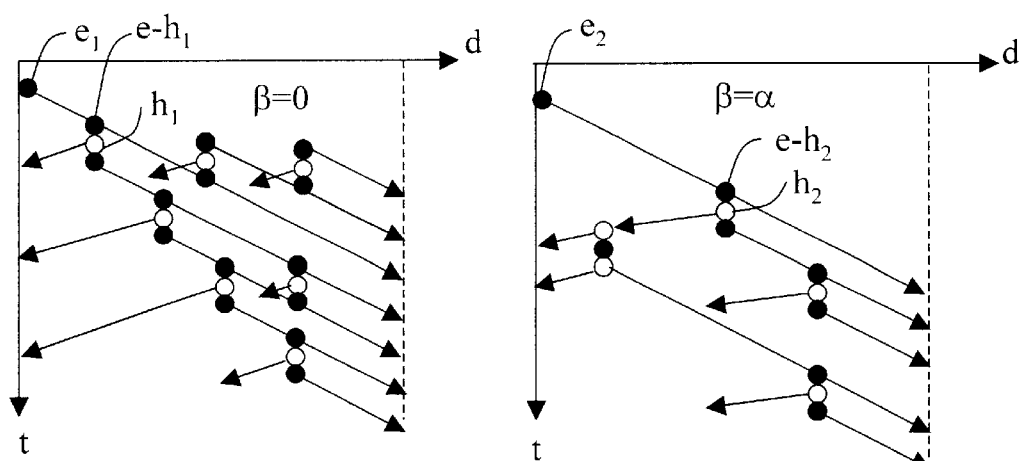
*Figure 2a*  *Figure 2b*
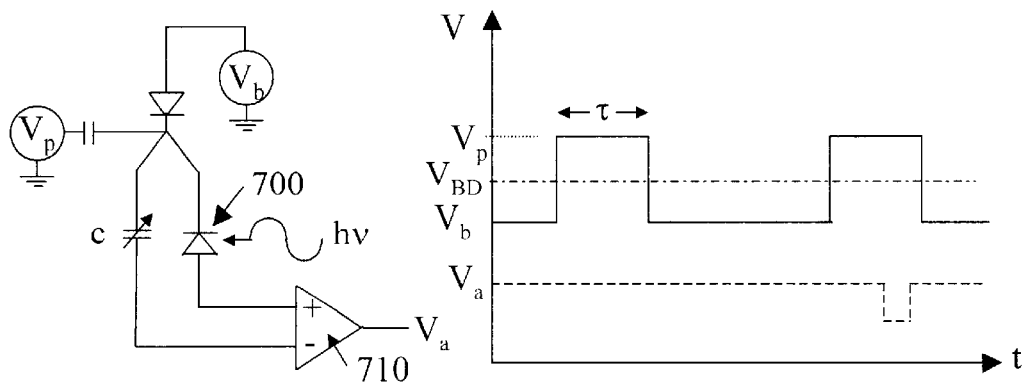
*Figure 7a*  *Figure 7b*

| |
|---|
| 580 Metallization Contact Layer |
| 570 $p^+$-InP Layer |
| 560 $i$-InP Multiplication Layer |
| 550 $n$-InP Field Control Layer |
| 540 $n$-InGaAsP Grading Layer |
| 530 $n$-InGaAs or $n$-InGaAsP Absorber |
| 520 $i$-InGaAs or $i$-InGaAsP Absorber |
| 510 $n^+$-InP Buffer Layer |
| 500 $n^+$-InP Substrate |

AVALANCHE PHOTODIODE FOR PHOTON COUNTING APPLICATIONS AND METHOD THEREOF

REFERENCE TO RELATED CASES

The present Application claims priority from Provisional Patent Application Serial No. 60/333,941, filed Nov. 28, 2001, which is incorporated herein by reference in its entirety.

BACKGROUND OF THE INVENTION

1. Field of the Invention

The present invention relates to avalanche photodiodes and photon counting technology.

2. Description of Related Art

Avalanche Photodiodes (APD) are well known photosensitive devices used to convert optical signals into electrical signals. As such, APD's behaves like standard photodiodes, as both APD's and photodiodes convert optical energy into electrical signal. However, APD's additionally incorporate a gain mechanism internal to the device itself, making it more sensitive. That is, while in a conventional p-i-n photodiode an individual photon is converted into one electron-hole pair, in an APD for each individual photon absorbed multiple electron-hole pairs are generated. This multiplication, however, introduces unwanted noise to the APD's output. Therefore, there's a constant effort by APD researchers and manufacturers to produce a sensitive, but reduced-noise, APD.

FIG. 1 depicts one possible structure of an APD 100 in a somewhat simplified form. While the depicted example APD 100 of FIG. 1 is in an etched mesa-form, the entire discussion herein is equally applicable to APD of the bulk-planar form. The APD 100 comprises a p-InP substrate 110; a p-InP buffer layer 120 and an n-InP layer 130, forming the wide-bandgap multiplication region; an n-InGaAsP grading or bandgap-transition layer 140 of an intermediate bandgap; and an n-InGaAs narrow-bandgap absorption layer 150. The intermediate-bandgap transition layer 140 is generally provided in order to reduce accumulation of charges at the interface between the multiplication and absorption regions, 130 and 150, respectively. Layers 105 and 115 are contacts, which can be made of, for example, AuInZn or AuSn. In this example, photons hv are collected from the substrate side.

The example APD 100 depicted in FIG. 1 is of the separate absorption and multiplication (SAM) APD type. That is, in order to obtain high sensitivity to infrared light, the APD absorption region is built using narrow-bandgap InGaAs material 150. Using a wider bandgap material such as InP for the absorption region would not result in the APD having comparable infrared sensitivity. Similarly, in order to obtain adequate gain properties in the APD multiplication region 130, the multiplication material is optimally a wide-bandgap semiconductor, in this example InP, that is able to support the high electric fields needed to achieve charge multiplication without, at the same time, creating excessive unwanted carriers through an electric field-assisted method known as tunneling. In this manner, the photogeneration of carriers takes place in a material optimized for absorption and not in the multiplication region. Lastly, because SAM APDs comprise two semiconductor materials with distinct bandgaps, one or more grading layers 140 of intermediate bandgap materials are used to prevent trapping of charged carriers that would otherwise occur at the heterointerface between the dissimilar regions 130 and 150.

The multiplication noise of an APD has been generally shown to be a function of k, the ratio of hole to electron ionization constants within the multiplication medium of the APD, i.e., $k=\beta/\alpha$. Note, however, that in some publications k is provided in terms of electron to holes ionization constants, i.e., $k=\alpha/\beta$. However, unless specifically noted otherwise, in this disclosure the convention $k=\beta/\alpha$ applies. In a series of papers, McIntyre et al., demonstrated that to improve the APD's performance, one needs to achieve as low k value as possible. For example, they showed that an APD having k value approaching 1 would have a low gain-bandwidth product, whereas an APD having low values (k much less than 1) would have high gain-bandwidth product.

McIntyre, R. J., *Multiplication Noise in Uniform Avalanche Diodes*, IEEE Transaction on Electron Devices, ED 13, 164–168 (1966); McIntyre R. J., *A New Look at Impact ionization—Part I: A Theory of Gain, Noise, Breakdown Probability, and Frequency Response*, IEEE Transaction on Electron Devices, 46, 1623–1631 (1999); Yuan, P., Anselm, K. A., Hu, C., Nie, H., Lenox, C., Holms, A. L., Streetman, B. G., Campbell, J. C., and McIntyre, R. J., *A New Look at Impact Ionization—Part II: Gain and Noise in Short Avalanche Photodiodes*, IEEE Transactions on Electron Devices, 46, 1632–1639(1999).

These works led researches on a quest to discover low-k materials and structures for use in APD multiplication regions. For example, Campbell et al., have demonstrated that noise and gain-bandwidth performance can be significantly improved by utilizing very thin multiplication regions. They noted that InP has approximately equal hole and electron ionization rates (i.e., $k \approx 1$) and that, therefore, InP APD's have high multiplication noise. They proposed an APD having a thin (200 nm–400 nm) $In_{0.52}Al_{0.48}As$ multiplication region; demonstrated to result in k=0.18. They also noted, however, that thinning the multiplication region must be accompanied by an increase in the carrier concentration in the multiplication region. Otherwise, electric field in the narrow-bandgap absorbing layer would be too high and tunneling will ensue, leading to excessive dark current.

Campbell, J. C., Nie H., Lenox, C., Kinsey, g., Yuan, P., Holmes, A. L., Jr. and Streetman, B. G., *High Speed Resonant-Cavity InGaAs/InAlAs Avalanche Photodiodes*, IEEE Journal of High Speed Electronics and Systems 10, 327–337 (2000); Campbell, J. C., Chandrasekhar, S., Tsang, W. T., Qua, G. J., and Johnson, B. C., *Multiplication Noise of Wide-Bandwidth InP/InGaAsP/InGaAs Avalanche Photodiodes*, Journal of Lightwave technology 7, 473–477, (1989); Kinsey, G. S., Hansing, C. C., Holmes, A. L. Jr., Streetman, B. G., Campbell, J. C., and Dentai, A. G., *Waveguide $In_{0.53}Ga_{0.47}As$—$In_{0.52}Al_{0.48}As$ Avalanche Photodiode*, IEEE Photonics Technology Letters 12, 416–418 (2000); Kinsey, G. S., Campbell, J. C., and Dentai, A. G., *Waveguide Avalanche Photodiode Operating at 1.55 m with a gain-Bandwidth Product of 320 GHz*, IEEE Photonics Tachnology Letters 13, 842–844 (2001).

APDs can be operated in two regimes: the linear regime and the breakdown regime, the latter often referred to as Geiger mode. In the linear regime, the APD is biased below its breakdown voltage, and the output photocurrent of the APD is proportional to the intensity of light striking the absorption region 150 and to the APD gain that occurs in the multiplication region 130. In the Geiger mode of operation, the APD is biased above its breakdown voltage. In this mode of operation, a single photon can lead to an avalanche breakdown resulting in a detectable current running through the device, which thereafter remains in a conductive state.

Consequently, the amplitude of the output signal in Geiger mode is constant and is not proportional to the number of photons absorbed. However, Geiger mode enables using APD's for single-photon detection applications.

Among the various utilities, APD's are used for single photon detection. Various applications require accurate detection of single photons. Among such applications is the detection of photon emission generated by switching semiconductor devices. Detection of such emission can be used to test, debug, and characterize the operation of such devices, especially in integrated circuits (IC's). One system that can be used to detect such emission is described in U.S. patent application Ser. No. 09/995,548, commonly assigned to the assignee of the subject application, and which is hereby incorporated herein by reference in its entirety. Other systems are described in, for example, 4,680,635; 4,811,090; 5,475,316; 5,940,545; 5,208,648; 5,220,403; and Khurana et al., *Analysis of Product Hot Electron Problem by Gated Emission Microscope*, IEEE/IRPS (1986); all of which are incorporated herein by reference in their entirety.

As can be gathered from the above-cited references, much effort is being spent in investigating improvements to APDs in order to improve its utilization in various applications, including single photon detection.

SUMMARY OF THE INVENTION

The present invention provides an improved APD structure and an improved manner of operating APDs, particularly beneficial for single photon detection applications. The present invention is based on the realization that while the prior art teaching is to reduce the k value as much as possible so as to minimize noise generated by the APD and improve their operating bandwidth, an APD having a k value substantially equal to unity is actually advantageous for single photon detection applications. Thus, in one aspect of the invention, an APD for single photon detection is provided wherein the APD is structured so as to have a high k value, e.g., approximately 1.

In one example, an APD is provided having an absorption region and a separate multiplication region, wherein the multiplication region has a ratio of hole to electron ionization constants, i.e., a k value, of approximately 1. In one specific example, the multiplication region comprises a doped InP layer. In other examples, the multiplication region is made of a material having a k value approaching 1; for example, $Ga_{0.18}In_{0.82}As_{0.39}P_{0.61}$ having k=0.82.

In one aspect of the invention, an APD is provided having an absorption region; an intermediate bandgap transition layer; a field control layer; and a multiplication region having k≅1. The field control layer is designed so as to produce an electric field reduction therein so as have the electric field over the absorption region at about 0–10V/μm while maintaining the electric field over the multiplication region in excess of its breakdown field.

In another aspect of the invention, an APD is provided having an absorption region; a multiplication region; an intermediate bandgap transition layer; and a field control layer. The field control layer is designed so as to produce a reduction of electric field that is equal to the multiplication region's breakdown electric field, plus or minus half the absorption region's tunneling onset field. The tunneling onset field is defined herein as the value of field that causes excessive tunneling, thereby causing an unacceptable level of dark current. The tunneling onset field is a strong function of the bandgap within the absorption region. Campbell et al., Id., used the figure 20V/μm for an $In_{0.53}Ga_{0.47}As$ absorption layer. For various embodiments of the invention, the inventors have found the tunneling onset field for an InGaAs absorption layer to be about 10V/μm.

The reason the field control layer is designed to produce a reduction in electric field equal to multiplication region's breakdown electric field, plus or minus half the absorption region's tunneling onset field, is twofold. First, the doping of the field control layer is typically imprecise during device manufacture, and this provides a tolerance to the manufacturing process. Second, during operation of the APD in the Geiger mode, the electric field within the multiplication region will be raised above the breakdown field in order to enable avalanches to occur. During such times, the electric field in the absorption region, which increases by the same value as the field in the multiplication region, must remain positive in order to remain photosensitive, and must not be allowed to exceed the breakdown field, in order to prevent excessive tunneling dark noise.

In yet another aspect of the invention, an APD is provided having an absorption region; a multiplication region; an intermediate bandgap transition layer; and a field control layer. The field control layer is doped with a dopant concentration designed so as to produce a reduction of electric field over the thickness of the field control layer that is equal to the multiplication region's breakdown electric field, plus or minus 5V/μm.

In another aspect of the invention, an APD is provided having an absorption region; a multiplication region; an intermediate bandgap transition layer; and a field control layer. The field control layer is designed so that the product of its dopant concentration and its thickness produces a reduction of electric field that is equal to the multiplication region's breakdown electric field, plus or minus about 5V/μm.

In another aspect of the invention, an APD is provided having an absorption region; a multiplication region; an intermediate bandgap transition layer; and a field control layer. The field control layer is designed so as to produce a reduction of electric field that, together with the field reduction over the multiplication region, causes a total field reduction that is equal to the multiplication region's breakdown electric field, plus or minus the absorption region's tunneling onset field.

In a further aspect of the invention, a method is provided for efficient detection of single photons, the method comprises constructing an APD having an absorption region; a multiplication region; and a field control layer. The method further comprises doping the field control layer so as to produce an electric filed reduction that is equal to the multiplication region's breakdown voltage plus or minus about 5V/μm. The method further comprises applying a potential across the APD so as to induce an electric field across the multiplication region that exceeds the breakdown field.

In yet a further aspect of the invention, a system is provided for detection of photons emitted from a semiconductor device. The system utilizing an APD detector having an absorption region; a multiplication region; and a field control layer. The field control layer is designed so that the product of its dopant concentration and its thickness produces a reduction of electric field that is equal to the multiplication region's breakdown electric field, plus or minus about 5V/μm.

Other aspects and features of the invention will be apparent to those skilled in the art from the description provided herein below, with reference to the appended drawings.

BRIEF DESCRIPTION OF THE DRAWINGS

The invention is described herein with reference to particular embodiments thereof which are exemplified in the drawings. It should be understood, however, that the various embodiments depicted in the drawings are for illustration only and may not limit the invention as defined by the appended claims.

FIG. 1 is a schematic depicting an etched mesa APD.

FIG. 2a illustrates the multiplication process occurring within an APD having k=0; while FIG. 2b illustrates the multiplication process occurring within an APD having k=1.

FIG. 3a is a plot of the avalanche buildup time for k=0.2 using a Monte Carlo simulation, while

FIG. 4a is a schematic representation of a conventional APD, with a graph showing the electric fields in corresponding regions of the APD; while

FIG. 7a is a circuit diagram of an electrical circuit that may be used to operate an APD in a Geiger mode according to an embodiment of the invention; while FIG. 7b is a graph showing the various potentials appearing in the circuit of FIG. 7a.

DETAILED DESCRIPTION

Figure 3A:
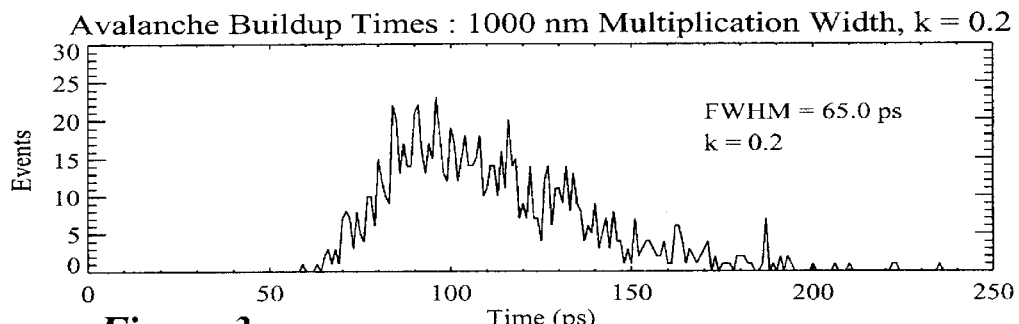

While workers in the art have been pursuing APD's having a low k value, the present inventor has discovered that for Geiger mode operation, for example, for single photon detection applications such as photon counting, an APD having a k value of approximately 1 is actually more desirable. To understand that, the operation of an APD having a k=0 and a k=1 is first investigated. FIG. 2a illustrates the multiplication process occurring within an APD having k=0; while FIG. 2b illustrates the multiplication process occurring within an APD having k=1. In both FIGS. 2a and 2b, holes are indicated by an empty circle and electrons are indicated by a filled circle. The top axis indicated thickness into the multiplication region, while the left top-to-bottom axis represents time.

In FIG. 2a, electron $e_1$ enters the multiplication region and impact ionizes, so as to generate an electron-hole pair e-$h_1$. Since in this case k=0, hole $h_1$ cannot impact ionize and therefore travels to the left and exits the multiplication region. Thus, there are now two electrons traveling to the right, and each impact ionizes again to generate two additional electron-hole pairs. The two holes travel to the left and exit the region, while the four electrons travel to the right and may impact ionize again. In this manner, a single electron injected into the multiplication region will sweep across the region, collecting more electrons along the way, so that many electrons exit the region at about the same time to generate one signal. Note that the time representation in FIG. 2a is somewhat misleading due to the limitations of two-dimensional drawing. However, following the above explanation, the reader can verify that a single electron entering the left side will cause several electrons to exit the right at about the same time.

In FIG. 2b, electron $e_2$ enters the multiplication region and impact ionizes, so as to generate an electron-hole pair e-$h_2$. Since in this case k=1, a hole is just as likely to impact ionize as an electron. Therefore, as hole $h_2$ travels to the left, it impact ionizes and creates another electron-hole pair, just as the electron traveling to the right impact ionizes and generates an electron hole pair. Thus, groups of electrons will exit the right side in succession. That is, as can be seen, in this case charged particles can "rattle" back and forth many times before the event settles down. Consequently, the frequency response of such a detector is low due to the longer multiplication time. Moreover, in this case, if the detector is biased in a Geiger mode, the process is not "self quenched" and the buildup of charges turns into a detectable avalanche current flowing through the detector.

Investigating the processes of FIGS. 2a and 2b, the present inventor discovered that the avalanche effect occurs most rapidly and with least randomness (i.e., jitter) for the case of k=1. This discovery is significant as, while investigators have been searching for a low k detectors to minimize noise, the present inventor has realized that if one uses a k=1 multiplication region, the timing accuracy of the detector for single-photon detection is improved. That is, while both cases, k=0 and k=1, indicate the timing of detection of the photon, the case of k=1 provides less randomness in the timing, therefore providing a more accurate timing.

Figure 3B:
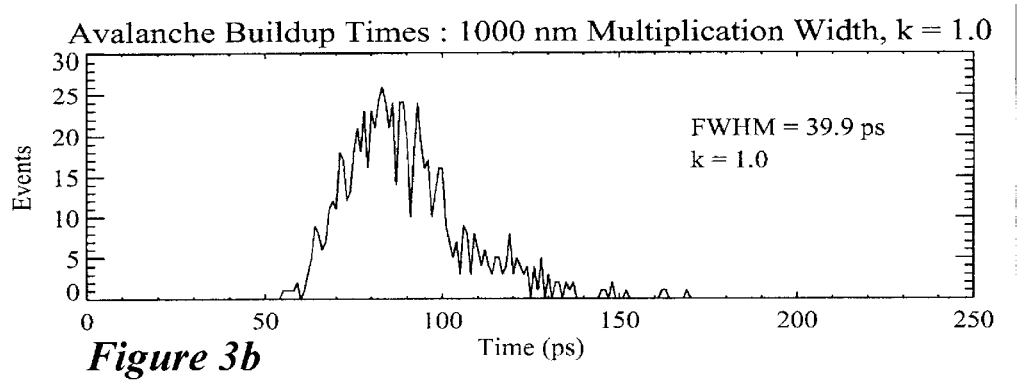
FIG. 3b is a plot of the avalanche buildup time for k=1 using a Monte Carlo simulation.

This discovery is demonstrated by the results depicted in FIG. 3a and 3b, which is a plot of the avalanche buildup time using a Monte Carlo simulation. In both FIGS. 3a and 3b the multiplication region thickness was set to 1000 nm. However, in FIG. 3a the value of k was set to 0.2; while in FIG. 3b it was set to 1.0. As can be seen, the jitter in the avalanche buildup time for k=1 is much lower than for k=0.2 (39.9 ps vs. 65.0 ps). Therefore, for accurate photon timing, an APD having k=1 provides better accuracy.

In the context of this specification, jitter is defined as an uncertainty in the exact time that an event took place. That is, the jitter is the uncertainty in the detector's "reporting" of the time of the event. More specifically, if a photon enters the detector at time t=0, a detector response, i.e., detection signal, will occur at a later time T. If this is repeated several times, one finds that the duration of T changes slightly. This variance is referred to herein as jitter. It is basically caused by the electrons inside the APD taking different paths each time a photon is detected, thereby causing variation in the time it takes for the avalanche to build up. In the context of this specification, jitter is measured as the distribution's full width at half maximum (FWHM). As can be seen in the simulation of FIG. 3b, using the inventive design the jitter may be reduced to 39.9 ps. In practice, however, conventional APD's have jitter of over 100 ps, while using the inventive design the inventor demonstrated APD's with jitter of 80 ps and even less than 65 ps.

Another result of the investigation is the discovery that for multiplication regions having k≅1, most of the timing jitter is due to the multiplication buildup time within the avalanche region, and is not due to the transit time variations within the APD's absorption region. This can be understood by considering the transit time of the carriers through the APD structure. For instance, a carrier generated in the absorption region passes through that region only once, on its way to the multiplication region. Once in the multiplication region, however, the carrier will "rattle" back and forth, as shown in FIG. 2b, a statistically uncertain number of times in order to build up the avalanche current. As a result, the contribution to the transit time spread, or jitter, through the APD is mostly determined by the multiplication region. Therefore, for photon counting application it is not necessary to construct a thinned-out absorption region as is taught by the prior art. Rather, a full absorption region can be constructed, leading to improved quantum efficiency. In fact, various APD's were constructed as described in more details below, achieving improved efficiency, yet having low jitter time of 80 ps and even less than 65 ps.

As previous investigators have discovered and reported previously, operating an APD in a Geiger mode increases the noise of the detector. That is, operating the detector by applying an electric field that is above the breakdown voltage causes excess tunneling current in the absorption region. The present inventor has investigated the operation of an APD in a Geiger mode for single photon counting. As is well known, single photon counting applications are impaired by tunneling current, since such effect drastically reduces the accuracy of the instrument. Accordingly, the present inventor has investigated the fields generated inside an APD and has provided a solution that enables Geiger mode operation at low tunneling current. This investigation and solution are discussed in the following paragraph, with reference to FIGS. 4a and 4b.

Figure 4A:
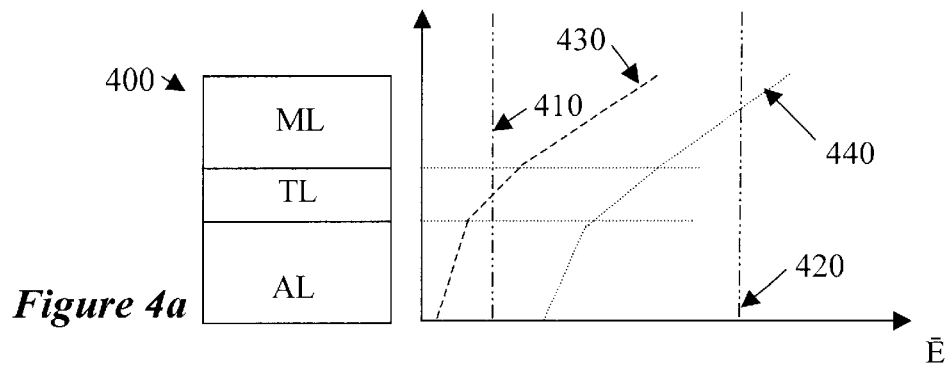
Figure 4B:
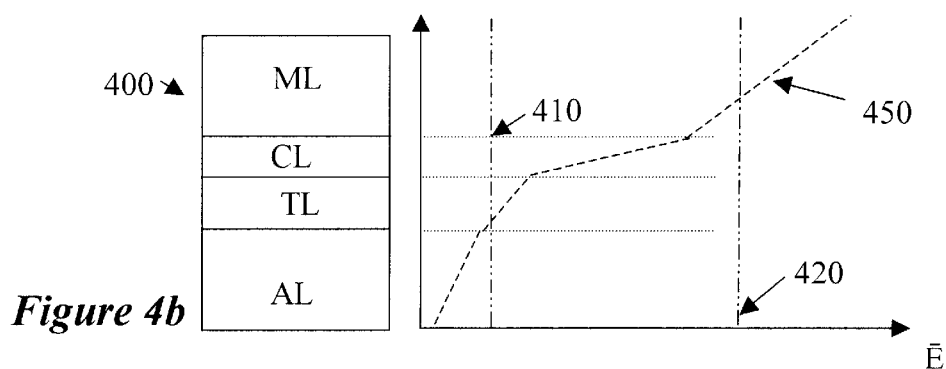
FIG. 4b is a schematic representation of an APD according to an embodiment of the invention, with a graph showing the electric fields in corresponding regions of the APD.

In FIG. 4a, block 400 represents an APD having an absorption layer AL (e.g., InGaAs), an intermediate-bandgap transition layer TL (e.g., InGaAsP), and a multiplication layer ML (e.g., InP). The relative thickness of the various layers is provided arbitrarily only as a demonstration. The layers are aligned with the Y-axis of the graph, which represents location along the bulk of the APD. The X-axis represent electrical field caused by voltage applied across the APD. The value of electric field that generates unacceptable tunneling current, i.e., tunneling onset field, is represented by line 410. The value of electric field that is at the breakdown point of the multiplication region is represented by line 420. Starting with a normal operation of the APD, that is, the voltage applied across the APD is lower than the multiplication region breakdown voltage, the field generated is exemplified by curve 430. As can be seen, since the applied voltage is below the breakdown voltage, the field in the multiplication region is below the breakdown value. Similarly, the field in the absorption region is below the unacceptable tunneling current value. This is the "optimal" situation sought after by prior art researchers, i.e., a fast response APD having low noise. For a similar depiction, see FIG. 3.4 in Torbjoern Nesheim's Master Thesis: Single Photon Detection Using Avalanche Photodiode, 1999 (available for download at www.vad1.com/qcr/torbjoern).

However, when the APD is operated in a Geiger mode, i.e., the voltage applied across the APD exceeds the breakdown voltage, the electric field in the multiplication region exceeds the breakdown value, as shown by curve 440. Consequently, the field in the absorption region also increases and exceeds the acceptable tunneling current value. Such a result is unacceptable for many single photon counting applications, since the noise level would be prohibitively high. According to an aspect of the invention, in order to obtain an APD that can be operated in a Geiger mode but with acceptably low noise level, a doped field control layer CL (FIG. 4b) needs to be designed so as to "shield" the absorption region, while allowing the field in the multiplication region to surpass the breakdown value. This is demonstrated by curve 450 in FIG. 4b, wherein the field control layer CL produces a reduction in the electric field so as to maintain the electric field in the absorption region at a low level.

Notably, the breakdown field in the multiplication region is a function of the thickness of the multiplication region, and the material from which it is made. So for any particular APD design, one can determine the breakdown field by considering the material and the thickness of the multiplication region. For many common materials, such as InP, the breakdown field can be easily obtained from published literature. Once this is obtained, the control layer CL needs to be designed so as to ensure that in the Geiger mode the field in the absorption region remains below the tunneling onset field. To achieve that, the APD needs to be designed so that when the APD is biased above the breakdown potential in the Geiger mode, the total drop of electric field over the multiplication region and the field control layer should be sufficient to ensure that the field within the absorption layer is below the tunneling onset field. The total drop of the filed can be expressed as:

$$\Delta E_T = \Delta E_{ML} + \Delta E_{CL} \quad \text{(Eqn. 1)}$$

where $\Delta E_T$ is the total drop in electric field over the multiplication layer and the field control layer, $\Delta E_{ML}$ is the field drop over the multiplication layer, and $\Delta E_{CL}$ is the field drop over the field control layer.

The total drop in field required has been determined to be the multiplication region's breakdown field, plus or minus about one half the absorption region's tunneling current limit field. That is:

$$\Delta E_T = E_{bd} \pm (\tfrac{1}{2}) E_{TC} \quad \text{(Eqn. 2)}$$

Where, $E_{bd}$ is the breakdown field in the multiplication region, and $E_{TC}$ is the tunneling current limit field, i.e., tunneling current onset value. On the other hand, the change in electric field across the multiplication layer and the control layer can also be expressed in terms of the factors relating to the layers themselves, as:

$$\Delta E_{ML} = \rho_{ML} e^- t/\epsilon \quad \text{(Eqn. 3)}$$

$$\Delta E_{CL} = \rho_{CL} e^- t/\epsilon \quad \text{(Eqn. 4)}$$

Where $\rho$ is the carrier density in the layer, $e^-$ is electron charge, t is the thickness of the layer, $\epsilon$ is the dielectric constant of the material the layer is made of. ML designates the values in the multiplication layer, while CL designates the values relating to the field control layer. In many APD designs the multiplication region is nominally undoped, hence the carrier density, $\rho_{ML}$, is as low as is practically possible. In such designs, $\Delta E_{ML}$ is much less than $\Delta E_{CL}$, and practically all of the electric field reduction is accomplished by the field control layer CL.

The selection of material and thickness of the multiplication region are performed with respect to the best multiplication performance. Consequently, for a given design of a multiplication layer, Eqn. 3 can be used to determine the field drop across the multiplication region. Then, the control layer needs to be designed so as to supply the additional field drop required. That is:

$$\Delta E_{CL} = \Delta E_T - \Delta E_{ML} \quad \text{(Eqn. 5)}$$

Substituting from Eqn 2, we get:

$$\Delta E_{CL} = E_{bd} \pm (\tfrac{1}{2}) E_{TC} - \Delta E_{ML} \quad \text{(Eqn. 6)}$$

then, substituting from Eqn. 4, we get:

$$\rho_{CL} t = (\epsilon/e^-)[E_{bd} \pm (\tfrac{1}{2}) E_{TC} - \Delta E_{ML}] \quad \text{(Eqn. 7)}$$

Equation 7 specifies the product of field control layer doping level and thickness that will enable operation in a Geiger mode with very low noise.

In general, one may use the obtained value of $\Delta E_{ML}$ in Eqn 7. However, when the field drop over the multiplication region is small (as for example by having a nominally intrinsic multiplication region), or in order to obtain a higher safety margin, one may set $\Delta E_{ML}$ equal to zero, so that the field drop across the control region equals the total field drop required for low noise operation.

Figures 5, 6:
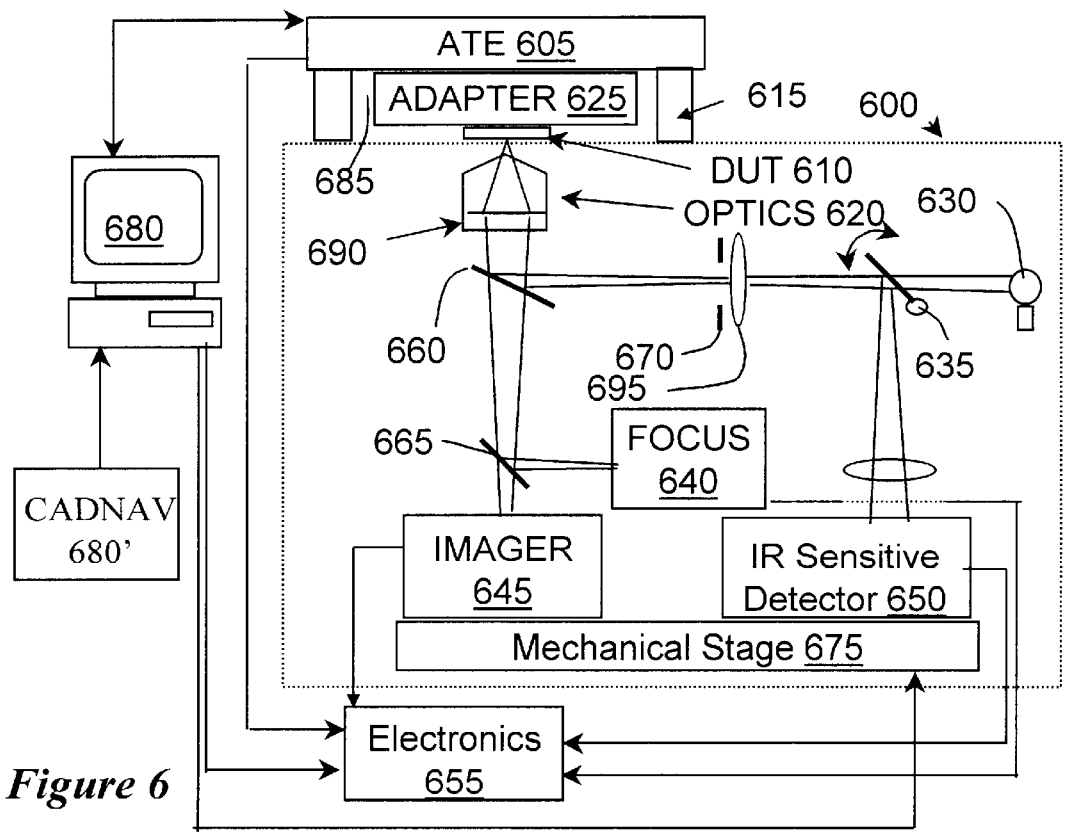
FIG. 5 is a schematic representation of various layers comprising an APD according to an embodiment of the invention.
FIG. 6 is a schematic representation of a photon counting apparatus utilizing an APD according to an embodiment of the invention.

The relationship expressed in Eqn. 7 has been used to produce an APD according to one embodiment of the present invention. This example APD was designed for photon counting applications, and utilizes an InGaAs absorption layer and a doped InP multiplication layer. An example of the layers of an APD according to an embodiment of the invention is shown in FIG. 5. The layers depicted in FIG. 5 can be made in either bulk-planar or etched-mesa form, and the thicknesses of the layers are shown here illustratively only. A substrate 500 made of n+InP is provided, upon which a buffer layer 510 made of n+InP is deposited or grown. An absorber layer 520 may be made of either i-InGaAs or i-InGaAsP, and is followed by an absorber layer 530 of n-InGaAs or n-InGaAsP. An intermediate bandgap grading layer 540 of n-InGaAsP is then provided. Notably, while in this embodiment a single grading layer is used, in other embodiments several grading layers may be used as necessary to more smoothly transition from the low bandgap absorption region to the high bandgap multiplication region. As is known in the art, grading layers are used to avoid charge trapping at the interface between the differing bandgap materials. For example, this can be done using three grading layers of the formula $Ga_xIn_{1-x}As_yP_{1-y}$, with the three grading layers typically having bandgap absorption cutoffs, $\lambda_c$, of 1.1, 1.3, and 1.5 μm, respectively). The grading layer or layers are followed by a doped control layer 550, made of n-InP. The amount of doping and the thickness of the control layer 540 were designed using the relationship of Eqn. 7. The multiplication layer 560 is made of i-InP, and is followed by a transition layer 570, made of p+-InP. Metallization layer 580 is provided to enable an electrical contact.

Notably, in order to operate an APD in a Geiger mode, a relatively high voltage is applied across the device, e.g., 25–65 volts. Consequently, a high electric field is generated across the APD. However, a high electric field would induce excessive tunneling current in the absorption region 520, thereby generating an unacceptable noise level. Accordingly, a doped field control layer 550 is provided. The field control layer 550 maintains the high electric field in the multiplication region 560, but "shields" the absorption region 520 from the electric field. That is, the product of the doping of control layer 550 and its thickness, i.e., $\rho_{CL}t$, is designed to maintain an electric field at the absorption region 520, below the tunneling onset level. According to one particular example, the doping-thickness product of control layer 550 was $2.7*10^{12}cm^{-2}$, while its thickness was about 0.1 μm. In this example, the APD was operated at the breakdown voltage, while the field at the absorption region was maintained at 5V/μm, which was about half the allowed tunneling value (for the example InGaAS absorption layer) of 10 V/μm. In this example the control region 550 provided an electric field reduction of about 40V/μm across its thickness.

According to further embodiments, various control layers were designed having a thickness of 0.10 μm and doping levels in the range of $2.8–3.4*10^{17}cm^{-3}$. Again, in these embodiments, at the breakdown voltage the maximum field at the absorption region was just over 5 V/μm. On the other hand, for the upper doping range the field at the absorption region actually was negative about 4.5 V/μm. Thus, such an APD enables operation at voltages above the breakdown voltage, while still maintaining very low field at the absorption region, thereby generating very little noise. For example, for the higher end of the doping provided in this example, one may operate the APD at 10 V/μm above the breakdown field and the field in the absorption region would still remain at about 5 V/μm, which is below the maximum allowed field of 10 V/μm. Accordingly, it is advantageous to dope an InP field control region to a level of about $10^{16}–10^{18}cm^{-3}$.

In another embodiment of the invention, an APD having the structure as provided in the example of FIG. 5 is designed to operate at below room temperature. Ideally the detector would be run around −150 deg C.; eventually when InP processing technology improves enough, this will be the optimal operating point. Presently, however, impurities make operating at these reduced temperatures impractical. Accordingly, in this embodiment the APD is designed to operate at temperature ranges of −90 to −40° C. or −80 to −50° C. Notably, at such temperatures, dopants in control layer 550 can freeze out, thereby making the field control layer 550 lose its effectiveness at reducing the electric field across absorption layer 520. Therefore, according to this embodiment of the invention, the dopant concentration in control layer 550 is increased to as to compensate for the frozen out dopants. According to this embodiment, the doping of control layer 550 is in the range of $2.5*10^{16}–3.5*10^{18}cm^{-3}$.

According to another embodiment of the invention, an APD is constructed having the layers as in the example of FIG. 5, except that multiplication layer 560 is made out of a high k material. An examples of high k material suitable for this embodiment is $Ga_{0.18}In_{0.82}As_{0.39}P_{0.61}$ having k=0.82.

FIG. 6 is a general schematic depicting the major components of a testing and debug system utilizing an APD according to an embodiment of the invention. The system operates in conjunction with a commercially available automated testing equipment 605 (ATE). The ATE generally comprises a controller, such as a pre-programmed computer 680, and a test head which comprises an adapter 625 used to deliver signals generated by the controller 680 to the device under test (DUT) 610 in a manner well known in the art. Specifically, the ATE is used to generate signals that stimulate the DUT to perform various tasks, as designed by the chip designer to check and/or debug the chip. The various signals generated by the controller 680 are delivered to the DUT via the adapter 625. The adapter 625 may include a space transformer, a DUT load board and a DUT socket, in a manner well known in the art.

In the embodiment depicted in FIG. 6, the ATE test head is placed on top of a vibration isolated test bench 615, while the chamber 600 that houses the entire optics, imaging and sensing system, and an X-Y stage 675, is situated below. This provides a tremendous advantage as it allows the system to be used with any type and size of ATE without interference with, or making modification to any of the elements inside chamber 600. Rather, the ATE is used to place the DUT from above, so that it is visible to the optics 620 via opening 685. Stage 675 enables placing of the collecting optics at any locations within the opening 685.

The various elements of the system of FIG. 6 will be described with reference to its operational modes. Generally, the system operates in two modes: navigation mode and detection mode. In the description, references to "navigation mode" should be understood to include navigation, target acquisition, and imaging. Therefore, these terms may be used interchangeably herein. In the navigation mode, an illumination source 630 is used to illuminate the DUT. Illumination source 630 emits light in the infrared range using, for example, an IR laser, tungsten, or a halogen lamp. The light is focused onto and then reflects from the DUT to be collected by the collection optics 620 and selectively directed towards the imager 645 via beam splitter 660. The imager 645 can be any two-dimensional detector capable of imaging in the infrared range, such as, for example, a vidicon. IR vidicons are commercially available from, for example, Hamamatsu (http://usa.hamamatsu.com). Beam splitter mirror 665 is used to deflect part of the collected light to the optional focusing system 640. Alternatively, the imager 645 may be used for focusing.

The switchable mirror 635 needs to be capable of selectively varying the optical path between the navigation and detection modes. For that purpose, mirror 635 may be mechanically moved or rotated, or it may be made of an active element capable of variable reflectivity according to the selected mode so that, for example, in one mode it is totally reflective, while in the other mode it is totally transmissive. For a rotational implementation, a substrate may be made having half of it transmissive and the other half reflective. Such a substrate can be provided with a rotating mechanism to insert in the optical path the reflective of transmissive part as desired.

Additionally, a mechanized aperture 670 is provided at the image plane of the collection optics 620, together with field lens 695. Notably, in this embodiment the image plane of collection optics 620 is generated in two locations: at aperture 670 and lens 695, and at the detector 645. A feature of this embodiment is that the mechanized aperture 670 is illuminated from behind and is used to define the field of view at the image plane. That is, depending on the particular test to be run, one may wish to select any particular section of the DUT for emission. Using information about the chip design and layout stored in a CAD software, such as, for example, Cadence, and using navigation software, such as, for example, Merlin's Framework available from Knights Technology (www.electroglass.com), one may select a particular device for emission test. When the user selects a device or location, the system activates the stage 675 so that the collection optics is centered on the selected device or location. Then, the aperture 670 may be adjusted to increase or decrease the field of view as appropriate for the particular test desired.

When an appropriate field of view has been set and an image focused, mirror 635 is rotated so that the light path towards the IR sensitive detector 650 is established. Additionally, light source 630 is preferably shut off or blocked during testing. It should be appreciated, of course, that chamber 600 prevents any external light from reaching any of the optics, imagers and sensors enclosed within.

Photon sensing during testing is done by detector 650, which is an APD constructed according to an embodiment of the invention as described above and is operated in a Geiger mode. The signal from the detector 650 is sampled by the high-speed data acquisition electronics 655. Controller 680, which may be a general-purpose computer running dedicated software, is used to control the various elements of the system, such as the stage and sample. The controller 680 receives sync signals from the ATE 605.

FIG. 7a is a circuit diagram of an electrical circuit that may be used to operate an APD in a Geiger mode according to an embodiment of the invention; while FIG. 7b is a graph showing the various potentials appearing in the circuit of FIG. 7a. In order to limit the amount of noise, a voltage Vb below the breakdown voltage is applied to the APD. Then, when a photon emission is expected (e.g., per signal from the ATE), the voltage across the APD is increased to above the breakdown voltage by the pulse generator Vp. The duration, τ, of the pulse can be adjusted to a desired length depending on the specific application. The parallel load, c, is adjusted so that if no photon is detected by the APD 700, the potential across the two inputs of the differential amplifier 710 is the same. On the other hand, if a photon is detected by the APD and an avalanche event does occur, higher current would flow through the APD 700 than through the load c, thereby having a detection event across the differential amplifier 710.

An example of potentials across the circuit is shown in FIG. 7b. The Y-axis shows voltage, while the X-axis shown time. Both voltage and time are shown in an arbitrary scale, since both depend on the particular application. A dot-line mark shows the breakdown voltage $V_{BD}$ of the multiplication region. Vb is the voltage level applied by voltage supplier Vb of FIG. 7a; while Va is the output voltage of the differential amplifier 710. As shown, in a first time period, the voltage applied is Vb, which is the bias voltage below the breakdown voltage. Then, a window period τ, is created by raising the voltage by the pulse generator to Vp. During this first window no photon is detected, so the output of the amplifier 710 remains constant. The potential is then reduced to the bias potential Vb. A second window is then generated by the pulse generator, during which a photon is detected by the APD and an avalanche event occurs. Consequently, a pulse is output by the differential amplifier.

While the invention has been descried with reference to particular embodiments thereof, various modifications and variations may be made by those skilled in the art without departing from the scope and spirit of the invention as defined by the appended claims.

What is claimed is:

1. An avalanche photodiode designed for single photon detection applications, comprising:
   an absorption layer defining a tunneling onset field;
   at least one intermediate-bandgap transition layer;
   a field control layer;
   a multiplication layer defining a breakdown electric field;
   wherein said control layer is configured so as to generate one of:
   i. an electric field reduction therein equivalent to said breakdown electric field; and,
   ii. an electric field reduction therein that, together with an electric field reduction in said multiplication layer, provides a total field reduction equivalent to said breakdown electric field.

2. An avalanche photodiode according to claim 1, wherein said electric field reduction equals said breakdown electric field plus or minus half of the tunneling onset field of the absorption layer.

3. An avalanche photodiode according to claim 2, wherein said absorption layer tunneling onset field is up to 20 V/$\mu$m.

4. An avalanche photodiode according to claim 2, wherein said absorption layer tunneling onset field is about 5–10 V/$\mu$m.

5. An avalanche photodiode according to claim 1, wherein said field control layer comprises a doped InP.

6. An avalanche photodiode according to claim 5, wherein said multiplication layer defines a ratio of hole to electron ionization constants of about one.

7. An avalanche photodiode according to claim 6, wherein said multiplication layer comprises InP.

8. An avalanche photodiode according to claim 5, wherein said multiplication layer defines a ratio of hole to electron ionization constants of between about 0.7 and 1.3.

9. An avalanche photodiode according to claim 8, wherein said multiplication layer comprises $Ga_xIn_{1-x}As_yP_{1-y}$.

10. An avalanche photodiode according to claim 9, wherein said multiplication layer comprises $Ga_{0.18}In_{0.82}As_{0.39}P_{0.61}$.

11. An avalanche photodiode according to claim 1, wherein:

said absorption layer comprises one of InGaAs and InGaAsP;

said intermediate-bandgap transition layer comprises $Ga_xIn_{1-x}As_yP_{1-y}$ said control layer comprises n-InP; and said multiplication layer comprises i-InP.

12. An avalanche photodiode according to claim 11, wherein said intermediate bandgap layer comprises three grading layers of the formula $Ga_xIn_{1-x}As_yP_{1-y}$ and having λc=1.1, 1.3, and 1.5 μm, respectively.

13. An avalanche photodiode according to claim 11, wherein said absorption layer comprises a first absorber comprising one of i-InGaAs and i-InGaAsP, and a second absorber comprising one of n-InGaAs and n-InGaAsP.

14. An avalanche photodiode according to claim 1, wherein said control layer has a defined thickness, t, and a defined doping level, ρ, satisfying the relationship:

$$\rho t = (\epsilon/e^-)(E_{bd} \pm \tfrac{1}{2} E_{TC} - \Delta E_{ML});$$

where ε is the dielectric constant of the material said control layer is made of; $E_{bd}$ is said breakdown field; $E_{TC}$ is a tunneling current limit field in said absorption layer; $\Delta E_{ML}$ is field drop over said multiplication layer and has a value between zero and $E_{bd}$.

15. An avalanche photodiode designed for single photon detection applications, comprising:

an absorption layer defining a tunneling current limit field, $E_{TC}$;

at least one intermediate-bandgap transition layer;

a field control layer having a defined thickness, t, and a defined doping level, ρ;

a multiplication layer defining a breakdown electric field, $E_{bd}$;

wherein said defined thickness and defined doping of said field control layer are selected so as to generate one of:

i. an electric field reduction therein of about $E_{bd} \pm \tfrac{1}{2} L_{TC}$; and, ii. an electric field reduction therein that, together with an electric field reduction in said multiplication layer, provides a total field reduction of about $E_{bd} \pm \tfrac{1}{2} L_{TC}$.

16. An avalanche photodiode according to claim 15, wherein said tunneling current limit field, $E_{TC}$, may take on values from 1 V/μm to 20 V/μm.

17. An avalanche photodiode according to claim 15, wherein said multiplication layer defines a ratio of hole to electron ionization constants of between about 0.7 and 1.3.

18. An avalanche photodiode according to claim 15, wherein:

said absorption layer comprises one of InGaAs and InGaAsP;

said intermediate-bandgap transition layer comprises $Ga_xIn_{1-x}As_yP_{1-y}$ said field control layer comprises InP; and said multiplication layer comprises InP.

19. A single photon detection system comprising a collection optics and a photon detector, wherein said photon detector comprises an avalanche photodiode designed for single photon detection applications, said photon detector comprising:

an absorption layer defining a tunneling onset field;

at least one intermediate-bandgap transition layer provided over said absorption layer;

a field control layer provided over said transition layer;

a multiplication layer provided over said field control layer, said multiplication layer defining a breakdown electric field;

wherein said field control layer is configured so as to generate one of:

i. an electric field reduction therein equivalent to said breakdown electric field; and, ii. an electric field reduction therein that, together with an electric field reduction in said multiplication layer, provides a total field reduction equivalent to said breakdown electric field.

20. An avalanche photodiode according to claim 19, wherein said electric field reduction equals said breakdown electric field plus or minus half of the tunneling onset field of the absorption layer.

* * * * *